United States Patent [19]

Fair

[11] Patent Number: 5,751,019
[45] Date of Patent: May 12, 1998

[54] METHOD AND STRUCTURE FOR REDUCING SHORT CIRCUITS BETWEEN OVERLAPPING CONDUCTORS

[75] Inventor: James A. Fair, Mountain View, Calif.

[73] Assignee: Varian Associates, Inc., Palo Alto, Calif.

[21] Appl. No.: 350,763

[22] Filed: Dec. 6, 1994

[51] Int. Cl.$^6$ .................. H01L 27/108; H01L 29/04; H01L 29/76; H01L 31/112
[52] U.S. Cl. .................. 257/68; 257/310; 257/758
[58] Field of Search .................. 257/758, 754, 257/755, 756, 532, 68, 309, 310

[56] References Cited

U.S. PATENT DOCUMENTS

| | | | |
|---|---|---|---|
| 5,172,201 | 12/1992 | Suizu | 257/754 |
| 5,332,684 | 7/1994 | Yamamichi et al. | 437/52 |
| 5,381,028 | 1/1995 | Iwasa | 257/754 |
| 5,530,279 | 6/1996 | Yamamichi et al. | 257/532 |

OTHER PUBLICATIONS

Patent Abstracts of Japan, vol. 18, No. 461 (E-1597), Aug. 26, 1994 and JP-A-06 151760 (Sanyo Electric Co. Ltd.) May 31, 1994.
Patent Abstracts of Japan, vol. 16, No. 297 (E-1226), Jun. 30, 1992 & JP-A-04 079336 (Mastushita Electron Corp), Mar. 12, 1992.
Patent Abstracts of Japan, vol. 16, No. 539 (E-1289), Nov. 10, 1992 & JP-A-04 206569 (NEC Corp) Jul. 28, 1992.
Patent Abstracts of Japan, vol. 17, No. 672 (E-1472), Dec. 10, 1993 & JP-A-05 226583 (NEC Corp) Sep. 3, 1993.
Patent Abstracts of Japan, vol. 17, No. 276 (E-1372) [27], May 27, 1993 & JP-A-05 013676 (Toshiba Corp) Jan. 22, 1993.
Article by Eimore, et al, entitled *A Newly Designed Planar Stacked Capacitor Cell with High dielectric Constant Film for 256Mbit DRAM*, published in IEEE in 1993, 631–634.
Article by T. Ema, et al, entitled *3–Dimensional Stacked Capacitor Cell for 16M, and 64M DRAMS*, published in IEEE in 1988, 592 IDEM88–595 IDEM88.

Primary Examiner—Mahshid D. Saadat
Assistant Examiner—S. V. Clark

[57] ABSTRACT

Method and apparatus for reducing current leakage between overlapping conductive structures in a multi-layered integrated circuit device such as a thin film capacitor is described. A conductive structure operating as a raised lower electrode is preferably fashioned by step-like erosion using a photolithographic techniques atop a dielectric substrate. In accordance with this invention, the dielectric substrate itself is allowed to erode as well to space the conductive structure away from the problemmatic inner corners of the step. By so distancing such conductive structures, like electrodes, from these inside corners, even conventional deposition techniques can be used to fabricate a capacitive device of operational tolerance suitable for DRAM application without risk of unwanted electrode current leakage and possible shorting. By so separating, the capacitance of the device can be reliably increased by increasing the available three dimensional capacitor area and decreasing the film thickness rather than relying primarily on high permittivity dielectrics.

7 Claims, 2 Drawing Sheets

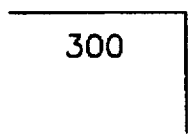
FIG. 3a
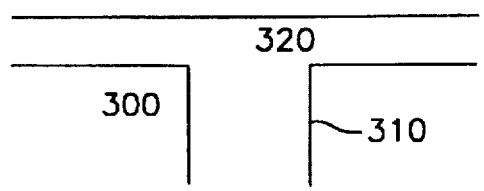
FIG. 3b
FIG. 3c
FIG. 3d
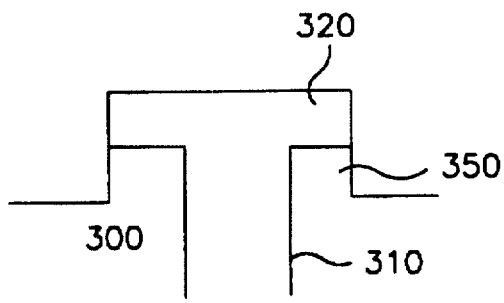
FIG. 3e
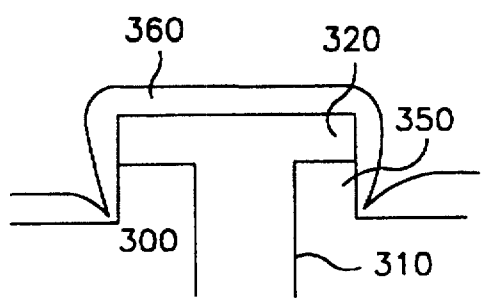
FIG. 3f
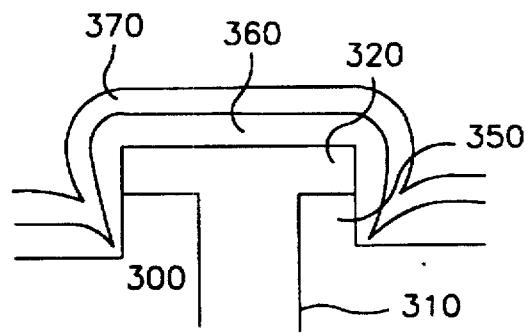
FIG. 3g

METHOD AND STRUCTURE FOR REDUCING SHORT CIRCUITS BETWEEN OVERLAPPING CONDUCTORS

FIELD OF THE INVENTION

The present invention relates to a semiconductor device and more particularly, to a method for fabricating such device e.g. a thin film capacitor in a semiconductor integrated circuit.

BACKGROUND OF THE INVENTION

Conventionally, a thin film capacitor formed in a semiconductor integrated circuit has a laminated structure of silicon oxide ($SiO_2$) and silicon nitride ($Si_3N_4$) with an electrode of either polycrystalline or single crystal silicon. An example of a technique for making the capacitor portion of a Dynamic Random Access Memory (DRAM) device is disclosed in the publication "International Electron Devices Meeting Digest of Technical Papers", 1988, pp. 592–595.

Conventional manufacturing processes for thin film capacitors have been limited by the degree to which the capacitor area may be scaled down while still maintaining sufficient capacitance. As the demand for higher densities in integrated circuits has increased in recent years, various trade-offs have been made in capacitor area, film thickness and dielectric constant in order to meet capacitance requirements. The conventional dielectric used for forming a thin film capacitor is, as described above, $SiO_2$ or $Si_3N_4$, wherein the dielectric constant is at most, about 7. In order to obtain the capacitance required in forthcoming DRAM's, a very small film thickness is required. For example, a film thickness of 1 nm or less would be required using a $SiO_2$ film in such a DRAM.

Because of the required small thickness it is difficult to develop a dielectric film which has a high enough breakdown voltage and a low enough leakage current to be useable. One approach to this problem has been to increase the electrode area by utilizing a three dimensional structure, whereby a thicker dielectric film can be used and still meet the capacitance requirements. However, the manufacturing process required is extremely complex having many steps. Another proposed solution has been to provide, as the capacitor dielectric, a material with a high dielectric constant; such as, $Ta_2O_5$, (Ba, Sr)$TiO_3$, Pb(Zr, Ti)$O_3$, Pb(Mg, Nb)$O_3$, or Pb(Mg,W)$O_3$, to allow for a thicker film to obtain the required capacitance. Some of these materials can have dielectric constants in excess of 300. This enables one to make a DRAM memory cell with a much simpler structure as shown in FIG. 2 of "A Newly Designed Planar Stacked Capacitor Cell with High Dielectric Constant Film for 256 Mbit DRAM," 1993 IEEE IEDM, Pg. 631 by T. Eimori et al, (FIG. 1 herein). However, in each approach there still remains a current leakage problem at the bottom inside corners of the step that conventionally forms in an etched structure. The crack or reduction in thickness that occurs in this corner region is largely due to the lack of perfect conformality in deposition step coverage, whether depositing dielectric or conductor.

To overcome the above described leakage problems, Yamamichi, et al in U.S. Pat. No. 5,332,684 have proposed the use of an additional interlayer of insulating material deposited over a high permittivity film covering a lower polysilicon electrode. The interlayer insulating film is etched to the point where the surface of the high permittively film is exposed, wherein an upper metal electrode is deposited by known Chemical Vapor Deposition (CVD) and/or sputtering methods. The use of this additional interlayer, while suppressing the increase in leakage current creates an additional problem of effectively decreasing the overall capacitance; since the electrode distance d, as used in the well known capacitance relation $C=\epsilon \cdot A/d$ is increased with all other variables represented in this relation remaining the same.

SUMMARY OF THE INVENTION

It is, therefore, an object of the present invention to overcome the current leakage problem existing in conventional integrated circuits formed by overlapping conductor layers, as for example in the capacitor portion of a DRAM device, without incurring a corresponding reduction in operational performance, such as a reduction in capacitance for a thin film capacitor.

It is a feature of the present invention to position the critically thin region, resulting from the nonconformal step coverage of an insulating layer after step erosion, e.g. by etching, at a distal location relative to the conductive layer which may function as a bottom electrode. Such distancing reduces the risk of a direct current path forming between the bottom and top conductive layers, which may together function as the electrodes of a capacitor.

These objects and features are realized in the present invention by fabricating a raised or stepped region of dielectric substrate, upon which the conductive layer, e.g. bottom electrode, is disposed. By elevating the position of the conductive layer, e.g. bottom electrode, above the troublesome inner corners of the step, the nonconformal thin region of deposition is now located at the base of a wholly dielectric step region, rather than at a conductor/dielectric step interface as is typical in conventional designs. Such distancing from the inside corners virtually eliminates risk of a conductor to conductor interface forming at the critically thinned corner region, thereby reducing any risk of current leakage resulting therefrom. As a result the structure circumvents the problem associated with current leakage at thinned regions in the insulator. In the case of a DRAM device the current leakage is obviated while maintaining the desired distances between electrodes and thereby optimizing the overall capacitance.

BRIEF DESCRIPTION OF THE DRAWINGS

FIGS. 3a through 3g depict a sequence of process steps, by way of example, which can be used to fabricate the structure of the present invention.

DETAILED DESCRIPTION OF THE INVENTION

Figure 1:
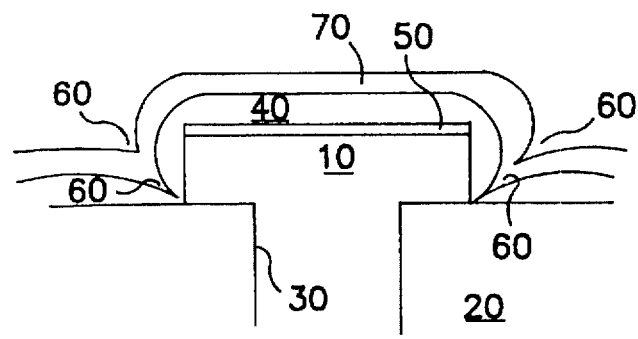
FIG. 1 depicts a conventional thin film device having a thinned region at the step junction of the electrode.

Referring to FIG. 1, a capacitor portion of a memory cell for a DRAM used in an integrated circuit is shown, being representative of overlapping metal layer structure of integrated circuits in general, and the problems associated with thinning of the dielectric at steps, resulting in yield and reliability problems, as well as a potential for shorting between the metal layers. According to FIG. 1, first electrode 10, made of a polycrystalline silicon or polysilicon or potentially any other conductor, is depicted on insulator substrate 20 which has been prepared by photolithographic and plasma etching processes to create contact hole 30 through substrate 20. Polycrystalline silicon electrode 10 is formed in the contact hole to extend into substrate 20 by processes well known to those skilled in the art, such as low pressure chemical deposition, wherein phosphorus (P) or a like element is diffused into the polysilicon to give the polysilicon a low resistance. Elements such as tantalum (Ta) and platinum (Pt) are then deposited to a thickness of abut 10 nm to about 300 nm to form barrier metal layer 50. Next, photolithography and plasma etching processes are used to shape electrode 10 into a predetermined shape, such as that depicted in FIG. 1. Thereafter, high permittivity film 40 of a material such as SrTiO₃ is formed in the entire upper surface by means of radio frequency (RF) magnetron sputtering, ion beam sputtering or other known processes. Again, high permittivity film 40 is etched by plasma or other conventional means such as those discussed in "Thin Film Processes" by John L. Vossen and Werner Kern, Academic Press, 1978, to give the profile depicted in FIG. 1. Because conventional deposition processes, such as PVD, are unable to produce exact edge profiles particularly as the feature size is reduced into the submicrometer range, there often develops a thin spot or crack at the base or concave corner of the step. This defect can occur with any deposition process that has less than 100% conformality. Even CVD processes are not perfectly conformal in high aspect ratio submicron features. Finally, a process such as plasma assisted chemical vapor deposition and sputtering or straight CVD is used to deposit upper electrode 70, typically comprised of a material such as titanium nitride (TiN), aluminum (Al) or platinum (Pt).

Figure 2:
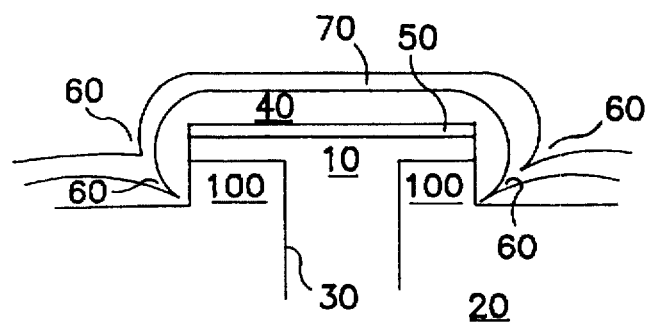
FIG. 2 depicts a structure in accordance with the present invention having a raised dielectric region.

Referring now to FIG. 2, the structure of the present invention is disclosed in which lower polysilicon electrode 10 is mounted on a raised region of dielectric 100. The cracking which may result in thinned trench portion 60 of the insulator is now in a direct path with a non-critical area of insulator substrate 20. Electrode 10 has been effectively displaced from the critically thinned area 60, and a direct path no longer exists between upper electrode 70 and lower electrode 10 as a result. The overall capacitance as a result of the modified structure remains unaffected since the distance between upper electrode 70 and lower electrode 10 remains unchanged.

Referring now to FIG. 3a to 3g, one of many possible processes for creating displaced region 100 is shown. As previously discussed, the process described herein relates to a capacitor portion of a memory cell for a DRAM; however, the concept described for displacing an electrode away from the critically thinned area of an insulator, while maintaining overall operational effectiveness, is applicable in general to the manufacture of overlapping metal layers in integrated circuits. According to FIG. 3a, insulator substrate 300 acts as a starting layer made of a material such as SiO₂ or other insulator materials. As described in FIG. 1 embodiment, the substrate has been prepared by photolithographic and plasma etching processes to create contact hole 310 through substrate 300. Next, as shown in FIG. 3b, conductive material 320 of, for example, polysilicon, is deposited to fill in contact hole 310 and cover the surface of substrate layer 300 by processes well know in the art and previously described herein. An etch mask 330 of known photoresists (organic polymers) is next applied using photolithography and first conductor 320 is etched by known techniques previously described to give a lower electrode 320 as shown in FIG. 3c. Mask element 330 and electrode element 320 are then raised as a self aligned mask, and the etching process is continued into substrate 300 to form raised region 350 as shown in FIG. 3d. The mask is stripped away to reveal the structure of FIG. 3e. Thereafter, an insulator 360, as previously described, is deposited on top of the patterned conductor 320, as shown in FIG. 3f. Lastly, an upper electrode of conductive material 370 is deposited, through techniques well known and discussed herein as shown in FIG. 3g.

By the method and structure of the present invention, present manufacturing processes for overlapping metal conductors which utilize insulator materials having less than perfect step coverage, can be employed while the problems associated therewith are overcome without compromising the operational performing the manufactured device.

While one exemplary method has been disclosed herein, it is understood that the concept of creating a means of displacing an electrode away from the critically thinned portion of an insulator which results from a less than perfect deposition and etching processes, may be accomplished in various different ways, all of which are contemplated within the scope of this invention.

What is claimed is:

1. An integrated circuit device, preferably a thin film capacitor, having overlapping conductive structures comprising at least:

a first electrode formed by a first conductor selectively deposited onto a raised surface of a first dielectric layer, said raised surface formed by predetermined step-like erosion of an otherwise substantially planar surface of the first dielectric layer, spacing said first electrode above the respective inside corners necessarily formed by said step-like erosion to produce a structure with no dielectric to conductor interface at the inside corners;

a second dielectric layer deposited onto said first electrode structure; and a second electrode formed by a second conductor deposited onto said second dielectric layer, said raised surface of said first dielectric layer providing sufficient spacing of said first electrode above said inside corners to reduce unwanted electrode current leakage.

2. A device in accordance with claim 1, further comprising a polycrystalline silicon electrode.

3. A device in accordance with claim 1, further comprising a single crystal silicon electrode.

4. A device in accordance with claim 1, further comprising a silicon oxide dielectric, e.g. SiO₂.

5. A device in accordance with claim 1, further comprising a silicon nitride dielectric, e.g. Si₃N₄.

6. A device in accordance with claim 1, wherein said second dielectric consists of a high permittivity material e.g. Ta₂O₅, (Ba, Sr)TiO₃, PB(Zr, Ti)O₃, Pb(Mg, Nb)O₃, Pb(Mg, W)O₃.

7. An integrated circuit device, preferably a thin film capacitor, having overlapping conductive structures comprising at least:

a first dielectric layer having a substantially planar surface portion and a raised portion projecting from the surface portion, said raised portion formed by predetermined step-like erosion, producing inside corners around the raised portion;

a first electrode structure formed by a first conductor selectively deposited onto the raised portion of the first dielectric layer, forming a structure with no dielectric to conductor interface at the inside corners;

a second dielectric layer deposited onto said first electrode structure and covering at least the inside corners of the substantially planar portion of the dielectric layer; and a second electrode formed by a second conductor deposited onto said second dielectric layer, said raised portion of the first dielectric layer providing sufficient spacing of the first electrode above the inside corners to reduce unwanted electrode current leakage.

\* \* \* \* \*